United States Patent
Pal et al.

(10) Patent No.: US 8,077,063 B2
(45) Date of Patent: Dec. 13, 2011

(54) METHOD AND SYSTEM FOR DETERMINING BIT STREAM ZONE STATISTICS

(75) Inventors: Ankit Pal, Ghaziabad (IN); Girraj K. Agrawal, Noida (IN); Asif Iqbal, Allahabad (IN)

(73) Assignee: Freescale Semiconductor, Inc., Austin, TX (US)

( * ) Notice: Subject to any disclaimer, the term of this patent is extended or adjusted under 35 U.S.C. 154(b) by 214 days.

(21) Appl. No.: 12/689,209

(22) Filed: Jan. 18, 2010

(65) Prior Publication Data

US 2011/0176646 A1   Jul. 21, 2011

(51) Int. Cl.
*H03M 7/46* (2006.01)

(52) U.S. Cl. ............. 341/63; 341/51; 341/52; 341/65; 341/67; 341/107

(58) Field of Classification Search ........... 341/50, 341/51, 52, 54, 59, 63, 65, 67, 106, 107
See application file for complete search history.

(56) References Cited

U.S. PATENT DOCUMENTS

| | | | | |
|---|---|---|---|---|
| 5,045,853 A | * | 9/1991 | Astle et al. | 341/67 |
| 5,740,186 A | * | 4/1998 | Widmer | 714/753 |
| 6,195,025 B1 | * | 2/2001 | Hassner et al. | 341/59 |
| 6,232,895 B1 | * | 5/2001 | Djupsjobacka et al. | 341/100 |
| 6,253,165 B1 | * | 6/2001 | Malvar | 703/2 |
| 6,425,107 B1 | * | 7/2002 | Caldara et al. | 714/759 |
| 6,642,864 B1 | * | 11/2003 | Djupsjobacka et al. | 341/100 |
| 7,039,121 B2 | * | 5/2006 | Shin et al. | 375/292 |
| 7,112,989 B2 | | 9/2006 | Ooshita et al. | |
| 7,274,312 B2 | * | 9/2007 | Bliss et al. | 341/50 |
| 7,386,777 B2 | | 6/2008 | Volkerink et al. | |

FOREIGN PATENT DOCUMENTS

WO     0013135     3/2000

* cited by examiner

*Primary Examiner* — Linh Nguyen
(74) *Attorney, Agent, or Firm* — Charles Bergere (57) ABSTRACT

An input bit stream is received and zone statistics such as zones count, zones center bit positions, and zones lengths are determined, where a zone is a set of non-transitioning bits in the input bit stream. Beginning and ending bit positions for each zone are determined simultaneously, and each beginning bit position is associated with an ending bit position. Zone statistics are calculated using the determined beginning and appropriate ending bit positions.

12 Claims, 10 Drawing Sheets

FIG. 1

| Bits/Phases | Phase 0 | Phase 1 | Phase 2 | Phase 3 | Phase 4 | Phase 5 | Phase 6 | Phase 7 |
|---|---|---|---|---|---|---|---|---|
| Bit0 | 1 | 0 | 0 | 0 | 0 | 0 | 0 | 1 |
| Bit1 | 1 | 1 | 1 | 1 | 1 | 1 | 1 | 1 |
| Bit2 | 1 | 0 | 0 | 0 | 0 | 0 | 0 | 0 |
| Bit3 | 0 | 1 | 1 | 1 | 1 | 1 | 1 | 0 |
| Bit4 | 0 | 0 | 0 | 0 | 0 | 0 | 0 | 0 |
| Bit5 | 0 | 1 | 1 | 1 | 0 | 0 | 0 | 0 |
| Bit6 | 0 | 0 | 0 | 0 | 0 | 0 | 0 | 0 |
| Bit7 | 1 | 1 | 1 | 1 | 1 | 1 | 1 | 1 |
| Bit8 | 0 | 0 | 0 | 0 | 0 | 0 | 0 | 0 |
| Bit9 | 1 | 1 | 1 | 1 | 1 | 1 | 1 | 1 |
| TV | 1 | 0 | 0 | 1 | 0 | 0 | 1 | 1 |

METHOD AND SYSTEM FOR DETERMINING BIT STREAM ZONE STATISTICS

BACKGROUND OF THE INVENTION

The present invention relates generally to data processing and communication systems, and, more specifically, to determining zone statistics of a bit stream in order to recover clock and data signals.

In a data transmission and communication system, a bit stream is transmitted from a transmitter module to a receiver module through a transmission channel. At the receiver module, various clock and data recovery techniques are applied to recover data from the received bit stream. The bit stream may include a set of continuous string of binary zeroes or ones. This continuous string of binary zeroes or ones is referred to as a zone. In order to recover data from the received bit stream, the zone statistics, for example, count of zones, length of each zone, center bit position of each zone, and so forth must be determined.

Zone statistics are calculated for numerous other applications, for example, data compression techniques such as run length encoding. Run length encoding entails replacing runs or a series of consecutive occurrences of a digit or a character in a data file with code words. Each codeword indicates the number of times a digit or character is repeated. Thus, a codeword requires less storage space, thus, compressing the data file. Additionally, digitized signals have runs of a binary value (binary zero or one), indicating that the signal is not transitioning. Thus, the concept of run-length encoding may be used for compressing a bit stream. In order to encode the bit stream using run-length encoding, the encoder searches the bit stream for a beginning of an occurrence of a binary value, for example binary zero. When a zero is detected in the bit stream, the encoder initiates a counter and counts the number of times the zero occurs before a binary one is reached. Then a codeword is formed that indicates the run-length of the zone of zeroes. Thus, zone statistics (zone length) are determined for replacing the run of zeroes with a code word.

Serial data transmission systems also involve manipulation of bit streams that have runs of binary ones or zeroes. As a result, such systems require calculation of zone statistics. Typically, in a serial data transmission system, data is transmitted serially over the transmission channel without an accompanying clock signal. The receiver module receives the serial data stream, recovers the data, and performs a serial-to-parallel conversion. The serial-to-parallel conversion results in parallel data streams that enable the receiver module to operate at lower frequencies than the serial data rate.

During serial data transmission, the transmitter module converts the parallel data into serial data by time-division multiplexing the data bits. Each data bit sent over the transmission channel is represented as a pulse of a predetermined time period of high or low voltage level. The switching between the high and low voltage levels occurs in synchronization with a clock signal local to the transmitter module. However, due to scarcity of resources, the clock signal is not transmitted to the receiver module. Thus, in order to recover data from the serial data stream, the receiver module detects bit boundaries using clock and data recovery schemes such as phase adjustment (phase alignment) or phase picking. In the phase adjustment (phase alignment) scheme, a phase locked loop (PLL) is used to adjust the sampling instant to a signal eye center of the received signal. This method of data recovery entails the usage of a digital phase detector, which calculates a phase angle between an input signal and the clock signal.

In the phase picking scheme, the serial data stream is sampled at a frequency higher than the frequency of the transmitter module clock signal. Alternatively, the phase picking clock and data recovery schemes can be applied by oversampling the bit stream using multiple phases of a reference clock signal that is local to the receiver module.

Figure 1:
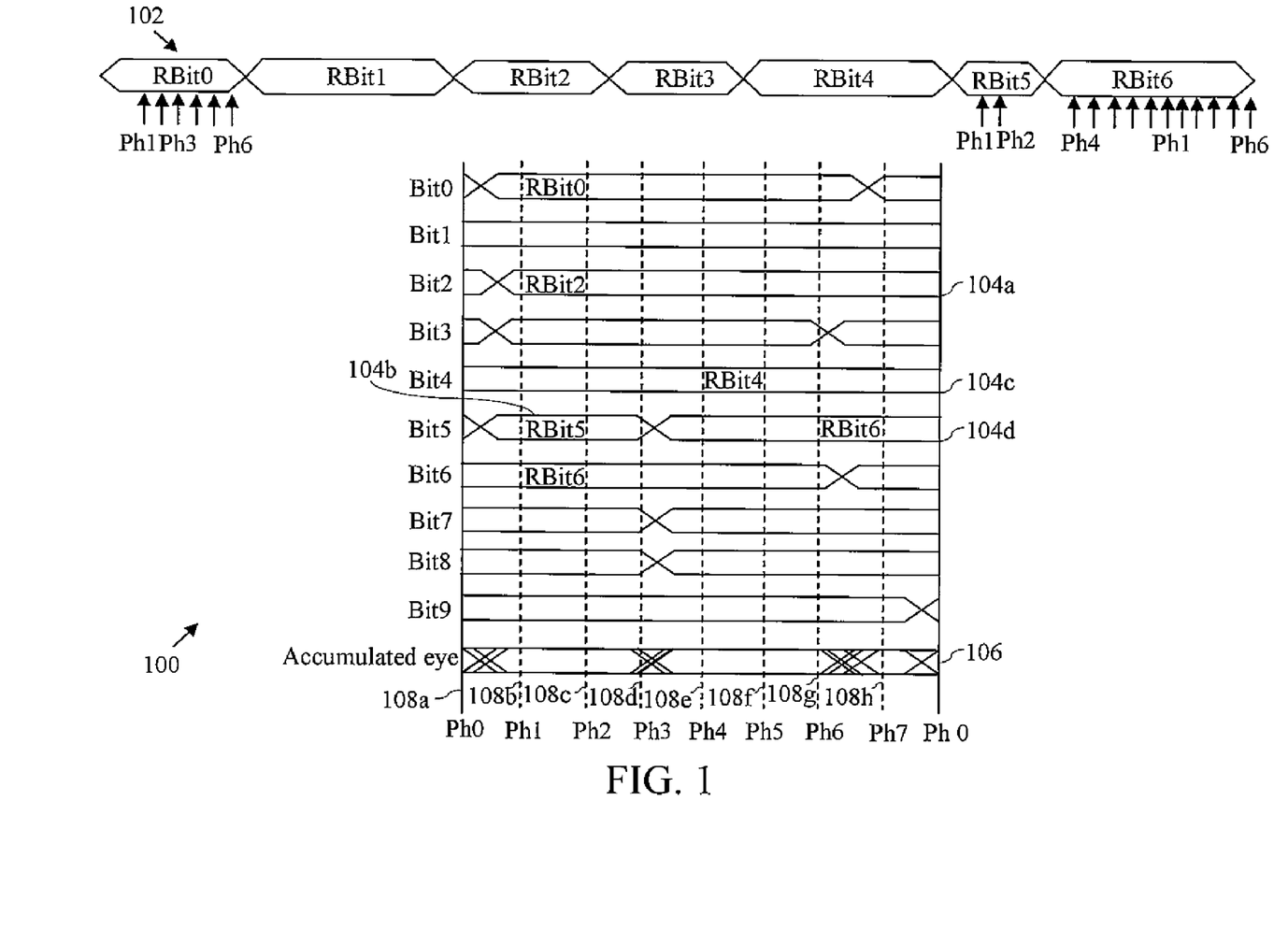
FIG. 1 is a timing diagram illustrating over sampling of an input bit stream.

Referring now to FIG. 1, a timing diagram 100 depicting oversampling of an input bit stream is shown. The timing diagram 100 includes waveforms corresponding to an input bit stream 102 as well as waveforms 104a-104d, and an indication of accumulated phase transitions 106.

The input bit stream 102 includes received data bits Rbit0-Rbit6. At the receiver unequal lengths of data bits are received due to the non-ideal nature of the transmitter module and the transmission channel. Some of the received data bits may become either prolonged or shortened as compared to an ideal bit width. Thus, the input bit stream 102 is oversampled using the phases of a reference clock signal with phases 108a-108h to obtain multiple data samples of each data bit of the input bit stream 102. The accumulated phase transitions 106 shows that there are bit transitions at phases 108a, 108d, 108g and 108h.

The received data bit Rbit5, which corresponds to waveform 104b, is a shortened bit since it spans only 2 phases, i.e. phases 108b and 108c (an 8 phase span is ideal). Further, the received data bit Rbit6, which corresponds to waveform 104d is an elongated bit since it spans eleven phases. Additionally, it may be observed that the received data bit Rbit2, which corresponds to waveform 104a is of normal length since it spans 8 phases. The accumulated phase transitions 106 also shows that the phases 108b and 108c, and the phases 108e and 108f do not include a transition in any of the waveforms that represent the received data bits.

Figure 2:
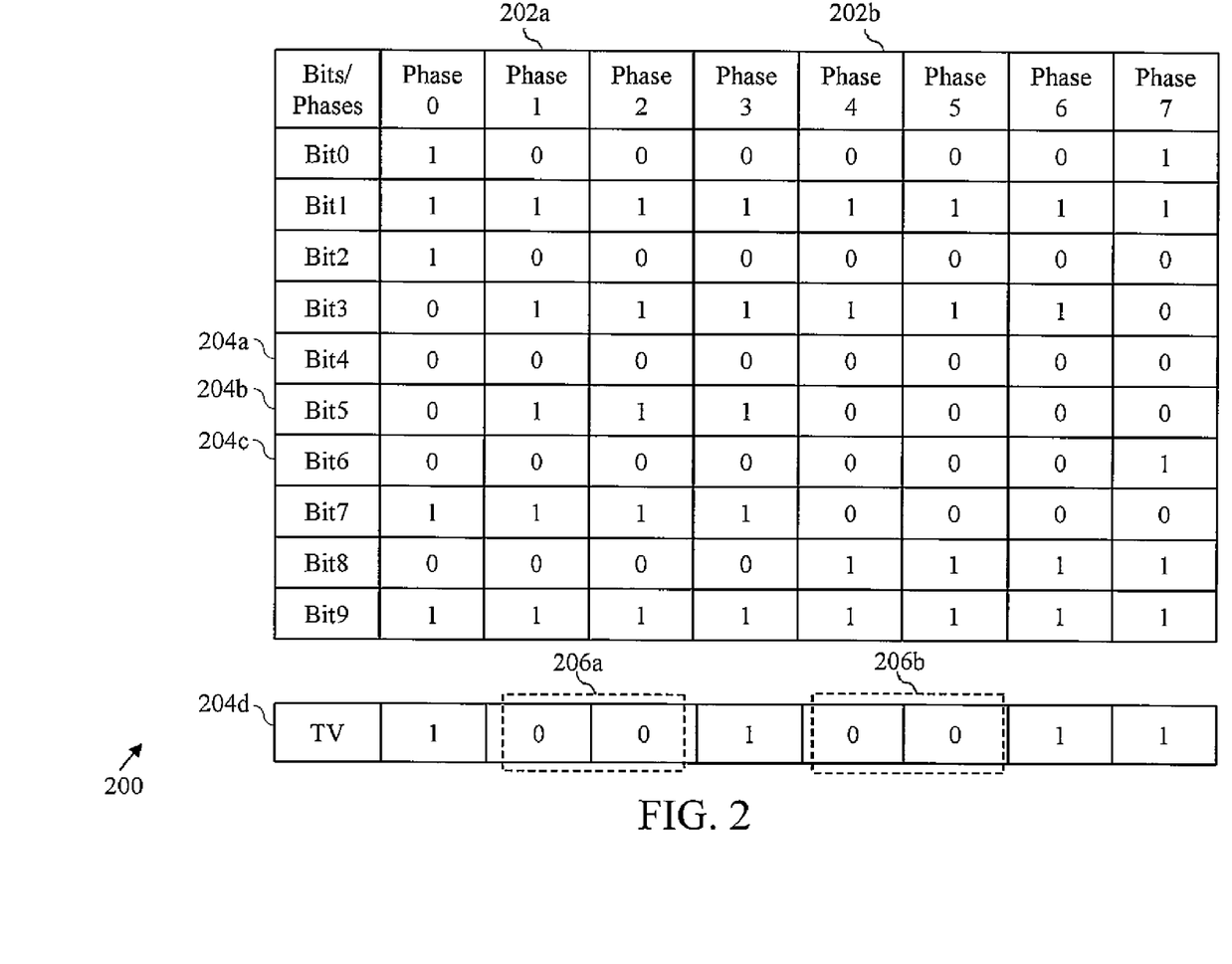
FIG. 2 is a data sample matrix illustrating a transition vector corresponding to an over sampled input bit stream.

Referring now to FIG. 2, a data sample matrix 200 illustrating a transition vector corresponding to the oversampled input bit stream is shown. The data sample matrix 200 includes columns that correspond to phases 0 to 7, and rows that correspond to bits 0-9 of the input bit stream 102. There is also a row 204d that corresponds to a transition vector. In the data sample matrix 200, phases 0-7 correspond to the phases 108a-108h of FIG. 1. For example, phase 108a (FIG. 1) corresponds to phase 0 in the data sample matrix 200, and so forth. Further, a binary value 0 is assigned to the bit positions that correspond to the non-transitioning phases.

Clock and data corresponding to a non-transitioning phase, which is also referred as a center phase, are recovered by the receiver module. That is, a center phase is a non-transitioning phase for which clock and data are recovered from the received bit stream. The transition vector may include a set of continuous strings of binary zeroes or ones referred as zones. To identify the center phase, zone statistics such as count of zones, length of a zone, and center bit position of a zone of all zones existing in the transition vector must be calculated. Conventionally, zone statistics are calculated using sequential and combinatorial circuits. A sequential circuit that includes a set of flip-flops, a XOR gate, and a counter connected in series is used for zone statistics calculation (explained in conjunction with FIG. 3). Alternatively, a combinatorial circuit that includes a multiplexer with $2^n$ unique combinations is used for zone statistics calculation.

Figure 3:
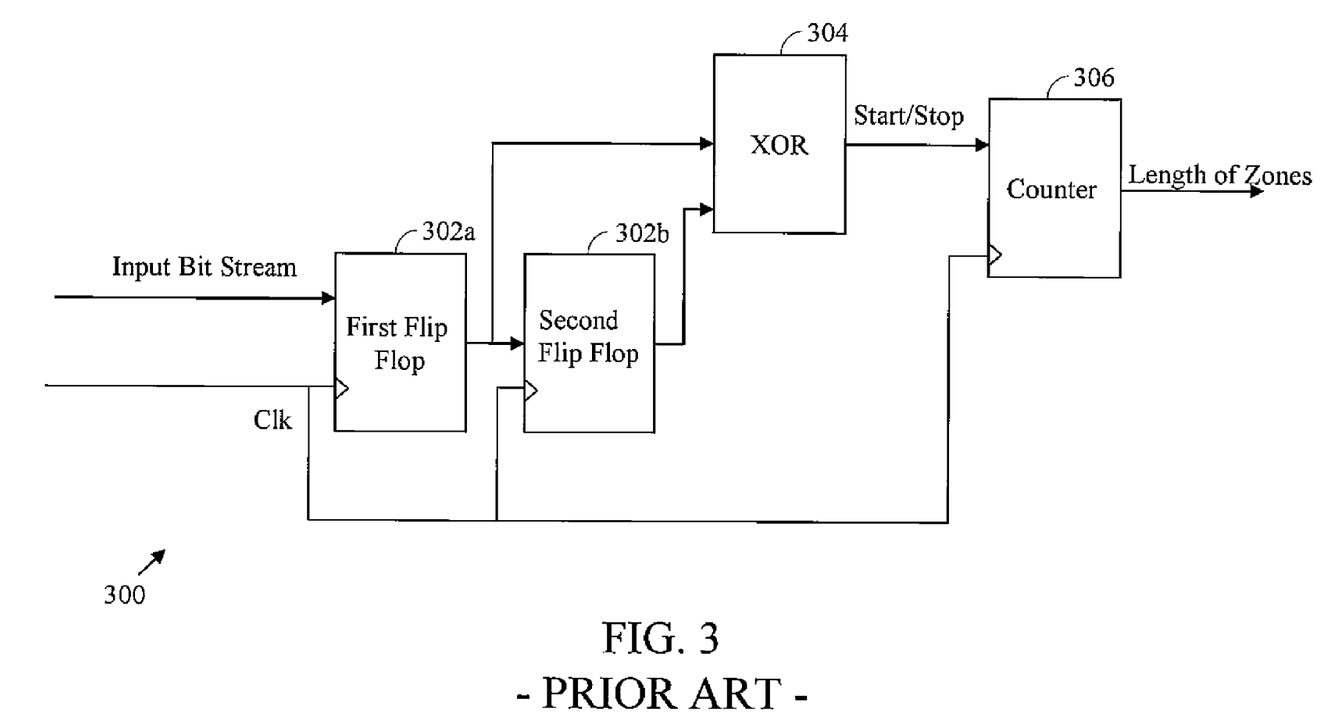
FIG. 3 is a schematic block diagram of a conventional sequential circuit for zone statistics calculation.

Referring now to FIG. 3, a block diagram illustrating a conventional sequential circuit 300 for zone statistics calculation is shown. The sequential circuit 300 includes flip-flops 302a and 302b, a XOR gate 304, and a counter 306. A clock input signal (CLK) is provided to the flip-flops 302a and 302b, and the counter 306. The flip-flops 302a and 302b, the XOR gate 304, and the counter 306 are connected in series. An input bit stream is provided to an input of the flip-flop 302a. The output of the flip-flop 302a is provided to the flip-flop 302b and the XOR gate 304. The output of the flip-flop 302b is provided to the XOR gate 304, and the output of the XOR gate 304 is provided to the counter 306.

The counter 306 calculates and outputs the length of each zone of the input bit stream. For example, assuming the input bit stream to be '10011000' which is provided serially to the flip-flop 302a, then the flip-flop 302a serially provides these bits to the XOR gate 304 and flip-flop 302b. The flip-flop 302b adds a delay in each bit that is twice the delay added by the flip-flop 302a. Thus, the XOR gate 304 compares a bit of the bit stream with the previous bit of the bit stream and therefore, detects the transitions in the bit stream. For each transition, the XOR gate 304 outputs a logic high signal. Once, a first logic high signal is received at the counter 306 it starts counting. The counter 306 stops counting when it receives a second logic high signal from the XOR gate 304. Referring to the example above, for the bits corresponding to the first and second positions, i.e., '10', the XOR gate 304 outputs '1', which causes the counter 306 to start counting. For the bits corresponding to the third and fourth positions, i.e., '01', a second logic high signal is generated by the XOR gate 304 and is detected as a stop of the zone by the counter 306. The length between two subsequent logic high signals corresponds to the length of the zone.

The zone statistics calculation technique outlined above has several drawbacks. Since, each stage of data processing (including transition detection by the XOR gate 304) requires at least one clock cycle then the total number of clock cycles required for statistics calculation is equivalent to the number of bits in the bit stream. This makes the process of statistics calculation data dependent. Consequently, the time required for statistics calculation is increased for long bit streams. Further, the zones and their statistics are identified sequentially, which increases processing time and latency.

As known in the art, the clock and data recovery based receivers include an equalizer and an automatic gain control unit (AGC). Typically, in clock and data recovery systems, a feedback loop provides a feedback signal to the equalizer and the AGC from the clock and data recovery unit for efficient gain control. Therefore, in a scenario when the conventional sequential circuit 300 is used for clock and data recovery and zone statistics calculation, the delays due to the sequential operation increase, which results in delaying the operation of the feedback loop, which consequently increases the delay in any corrective action to be taken by the feedback loop. Thus, the overall latency is increased considerably. Such an increase in latency leads to a substantial increase in the Bit Error Rate (BER) at the receiver. Also, with increases in increase in the latency, the receiver's ability to adapt to channel conditions decreases.

Many high speed serial interfaces, such as MIPI-MPHY, USB 3.0, SATA, and PCI Express, perform error and data correction. These high speed serial interfaces provide Acknowledgement/Negative Acknowledgements (ACKS/NACKS) to the transmitters to provide feedback based on accurate or inaccurate data reception. Thus, any latency at the receiver leads to a decrease in the overall throughput of the high speed serial interfaces.

Another conventional method used to calculate the zone statistics of a bit stream is with a combinatorial circuit, such as a multiplexer. For example, for a bit stream including eight bits, a multiplexer with $2^8$=256 input lines and eight select lines, and one output line is used. Zone statistics, such as a count of one or more zones, a center bit position of each zone, and a length of each zone, corresponding to the eight bits are calculated and stored using the 256 unique combinations that are possible for the eight bits. Thereafter, the input lines are loaded with the 256 calculated combinations and the eight bits of the input bit stream are provided on the eight select lines. This leads to the selection of one input line that is identical to the input bit stream. The unique combination on the input line is transmitted to the output line. A comparator compares the output on the output line with stored combinations. When a match is obtained, the comparator provides the zone statistics corresponding to that combination. It is evident that for designing a zone statistics calculator for an n bit stream, zone statistics corresponding to the $2^n$ unique combinations need to be calculated and stored in a look-up table. An increase in the number of bits in the bit stream increases exponentially the number of unique combinations, making this implementation impractical. Further, the logic depth levels required to implement the above logic increases with an increase in data bits in the bit stream.

It would be desirable to have a method and system for calculating zone statistics of a bit stream that has low latency, and performs zone statistics calculation efficiently without too many clock cycles. Additionally, the system and method should enable zone statistics calculation using less logic depth levels.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for determining one or more zone statistics of an input bit stream, such as a count of one or more zones of the input bit stream, a center bit position of each zone, and a length of each zone is provided, where a zone is a set of continuous, non-transitioning bits in the input bit stream. The input bit stream is received and one or more beginning and ending bit positions corresponding to the zones are identified substantially simultaneously, such as via parallel processing. The beginning bit position corresponds to a position where a bit of the input bit stream transitions from a first binary value to a second binary value, and the ending bit position corresponds to a position where a bit of the input bit stream transitions from the second binary value to the first binary value. Each beginning bit position is associated one of the ending bit positions. Subsequently, an appropriate ending bit position from the ending bit positions corresponding to the beginning bit positions is determined based on predefined criteria. The ending bit position that is closest to the beginning bit position is determined as the appropriate ending bit position. The zone statistics are calculated substantially simultaneously, such as via parallel processing, using the beginning bit positions and corresponding appropriate ending bit positions.

In another embodiment of the present invention, a system for determining zone statistics of an input bit stream, such as a count of one or more zones of the input bit stream, a center bit position of each of the zones and a length of each of the zones is provided. The system includes a receiver that receives the input bit stream. First and second encoders, connected to the receiver, identify one or more beginning bit positions and one or more ending bit positions corresponding to the zones. The beginning bit positions correspond to positions where bits transition from a first binary value to a second binary value and the ending bit positions correspond to positions where bits transition from the second binary value to the first binary value. The one or more beginning bit positions and the ending bit positions are identified substantially simultaneously by processing the bits of the bit stream in parallel. A rotator is connected the first and the second encoders, and associates each beginning bit position with an ending bit position.

A proximity encoder is connected to the first encoder and the rotator, and determines one or more appropriate ending bit positions from the one or more ending bit positions corresponding to the one or more beginning bit positions. The appropriate ending bit positions are determined based on predefined criteria. A statistics calculation unit is connected to the proximity encoder, and calculates the one or more zone statistics using the one or more beginning bit positions and the one or more appropriate ending bit positions.

In another embodiment of the present invention, a receiver for recovering a clock signal and data from an over sample input bit stream is provided. The receiver receives a set of data samples from an over sampling unit that over samples the input bit stream using a plurality of phases of a reference clock signal. The receiver includes a memory for receiving and storing the set of data samples. A transition vector calculation unit is connected to the memory and calculates a transition vector corresponding to the set of data samples. The transition vector is calculated based on one or more sets of non-transitioning phases in the data samples.

A zone identification and statistics calculation unit connected to the transition vector calculation unit determines zone statistics such as a count of the zones of the transition vector, a center bit position of each of the zones, and a length of each of the zones, where a zone is a set of contiguous non-transitioning bits in the transition vector. The zone identification and statistics calculation unit includes first and second encoders for identifying beginning and ending bit positions of the zones. These beginning and ending bit positions can be calculated substantially simultaneously. The beginning bit position corresponds to a position where a bit of the input bit stream transitions from a first binary value to a second binary value and the ending bit position corresponds to a position where a bit of the input bit stream transitions from the second binary value to the first binary value. Further, the one or more beginning and ending bit positions are identified simultaneously through parallel processing. A rotator is connected to the first and the second encoder, for associating each beginning bit position with the one or more ending bit positions.

The receiver further includes a rotator connected to the first and the second encoders, for associating each beginning bit position with one of the ending bit positions. A proximity encoder, connected to the first encoder and the rotator, then determines appropriate ending bit positions from the one or more ending bit positions, where the one or more ending bit position is associated with one beginning bit position from the one or more beginning bit positions. Additionally, the appropriate ending bit position is determined based on predefined criteria. The ending bit position that is closest to the beginning bit position is determined as the appropriate ending bit position. A statistics calculation unit also includes a statistics calculation unit, connected to the proximity encoder, for calculating the zone statistics using the beginning bit positions and the appropriate ending bit positions. The zone statistics can be calculated substantially simultaneously with each other. The receiver further includes a processing unit for recovering the clock signal and the data from the transition vector using the zone statistics.

In yet another embodiment of the present invention, a receiver for recovering clock and data from an input bit stream that is oversampled to generate a set of data samples is provided. The oversampled input bit stream corresponds to an input bit stream oversampled using a plurality of phases of a reference clock signal. The receiver includes a memory for receiving and storing the set of data samples. The receiver further includes a transition vector calculation unit for calculating a transition vector corresponding to the set of data samples. The transition vector is calculated based on one or more sets of non-transitioning phases in the data samples.

The system further includes a zone identification and statistics calculation unit for determining one or more zone statistics such as a count of one or more zones belonging to the transition vector, a center bit position of each one or more zones, and a length of each one or more zones. A zone is a set of non-transitioning bits in the transition vector. The zone identification and statistics calculation unit includes a first and a second encoder for identifying one or more beginning bit positions and ending bit positions corresponding to one or more zones belonging to the transition vector simultaneously through parallel processing. Further, the beginning bit position corresponds to a position where a transition occurs from a first binary value to a second binary value in the input bit stream and the ending bit position corresponds to a position where a transition occurs from the second binary value to the first binary value in the input bit stream.

The zone identification and statistics calculation unit further includes a rotator connected to the first and the second encoder, for associating each beginning bit position with the one or more ending bit positions. A proximity encoder, connected to the first encoder and the rotator, for determining one or more appropriate ending bit positions from the one or more ending bit positions corresponding to the one or more beginning bit positions. The appropriate ending bit position is determined based on predefined criteria. The zone identification and statistics calculation unit further includes a statistics calculation unit, connected to the proximity encoder, for calculating the one or more zone statistics using the one or more beginning bit positions and the one or more appropriate ending bit positions simultaneously through parallel processing. The receiver further includes a processing unit for recovering clock and data from the transition vector.

Various embodiments of the present invention provide a method and system for determining zone statistics, for example, a count of one or more zones of an input bit stream, a center bit position of the zones, and a length of each of the zones, where a zone is a set of contiguous non-transitioning bits of an input bit stream. The method and system of the present invention can determine the zone statistics in a single clock cycle, and thus, reduces latency at the output of the receiver. A combinational circuit is used to implement the method with less logic depth levels as compared to the logic depth levels in conventional combinational circuits.

Figure 4:
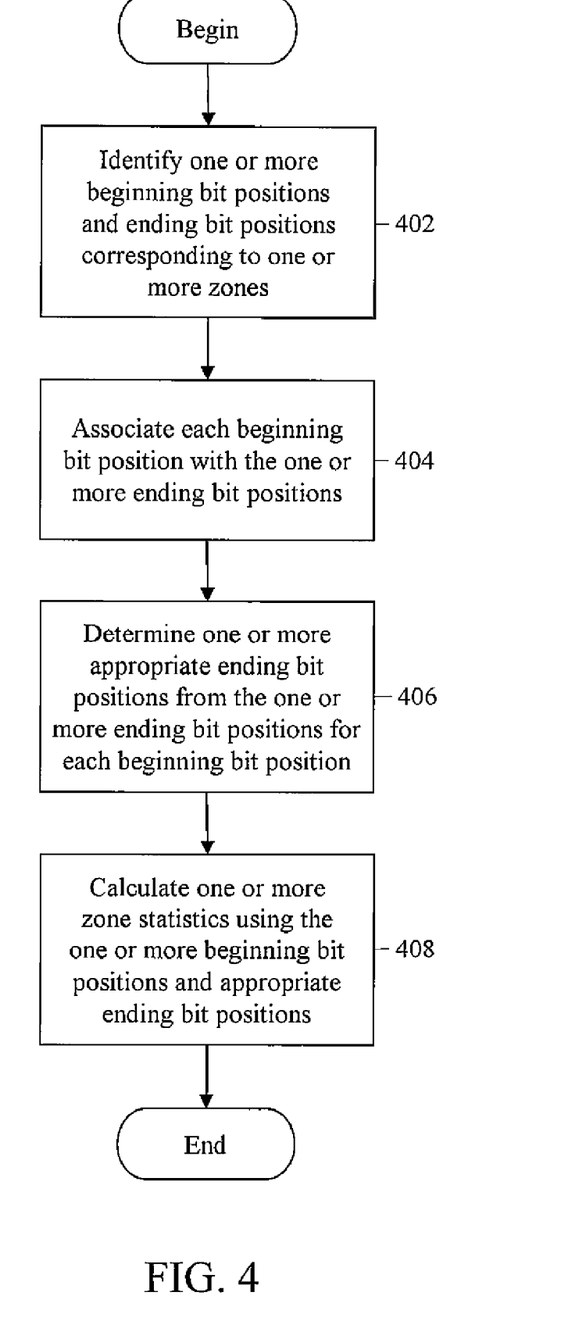
FIG. 4 is a flowchart illustrating a method for determining one or more zone statistics of an input bit stream in accordance with an embodiment of the present invention.

Referring now to FIG. 4, a flow chart illustrating a method for determining one or more zone statistics of an input bit stream in accordance with an embodiment of the present invention is shown.

First, an input bit stream is received. The input bit stream may be a serial input bit stream. In accordance with an embodiment of the present invention, the input bit stream is a transition vector obtained during the clock and data recovery process from a set of data samples.

At step 402, one or more beginning and ending bit positions are identified that correspond to one or more zones of the input bit stream. Each zone corresponds to a continuous string of binary zeroes or ones. A beginning bit position corresponds to a position where a transition occurs from a first binary value to a second binary value in the input bit stream, and an ending bit position corresponds to a position where a transition occurs from the second binary value to the first binary value in the input bit stream. In accordance with an embodiment of the present invention, the first binary value and the second binary value correspond to a binary value one and a binary value zero respectively. It will be apparent to a person with ordinarily skill in the art that the first and second binary value can be any combination of bits, or any equivalent thereof. For example, a bit stream {11000100} is received that includes eight bits corresponding to positions B0, B1, B2, and so on, as illustrated below in Table A.

TABLE A

| B0 | B1 | B2 | B3 | B4 | B5 | B6 | B7 |
|----|----|----|----|----|----|----|----|
| 1  | 1  | 0  | 0  | 0  | 1  | 0  | 0  |

For the above example, B1 and B5 are identified as the beginning bit positions. Further, B4 and B7 are identified as the ending bit positions. The bit position corresponding to a transition of a bit from binary value one to binary value zero is identified as the beginning bit position and the bit position corresponding to a transition of a bit from binary value zero to binary value one is identified as the ending bit position. Therefore, B1 and B5 are identified as the beginning bit positions, and B4 and B7 are identified as the ending bit positions. In a preferred embodiment of the invention, these beginning and ending bit positions are identified simultaneously through parallel processing. The one or more beginning bit positions and the ending bit positions will be explained in conjunction with FIGS. 5A, 5B, 5C, and 5D.

At step 404, each beginning bit position is associated with one of the one or more identified ending bit positions. Sets are generated by associating each beginning bit position with the one or more identified ending bit positions. So, continuing with the example above, two sets are generated for the beginning bit position B1, i.e., (B1, B4) and (B1, B7). Similarly, two sets are generated for the beginning bit position B5, i.e., (B5, B4) and (B5, B7).

At step 406, one or more appropriate ending bit positions are determined from the one or more ending bit positions corresponding to the one or more beginning bit positions in the input bit stream. An appropriate ending bit position is determined based on predefined criteria. In accordance with an embodiment of the present invention the predefined criteria includes proximity of the one or more ending bit positions with the corresponding beginning bit position. Thus, the ending bit position that is closest to the beginning bit position is determined as the appropriate ending bit position. For example, from the two sets generated for the beginning bit position B1, i.e., (B1, B4) and (B1, B7). The ending bit position B4 is closest to the beginning bit position B1, thus, the ending bit position B4 is determined as the appropriate ending bit position. Similarly, for all beginning bit positions in the bit stream the appropriate ending bit position is determined.

After the one or more appropriate ending bit positions are determined, at step 408 zone statistics are calculated using the one or more beginning bit positions and the one or more appropriate ending bit positions. Zone statistics include information related to a zone such as a count of each zone, a center bit position of each zone, and a length of each zone. In a preferred embodiment of the invention, the zone statistics are calculated substantially simultaneously such as via parallel processing.

Figure 5A:
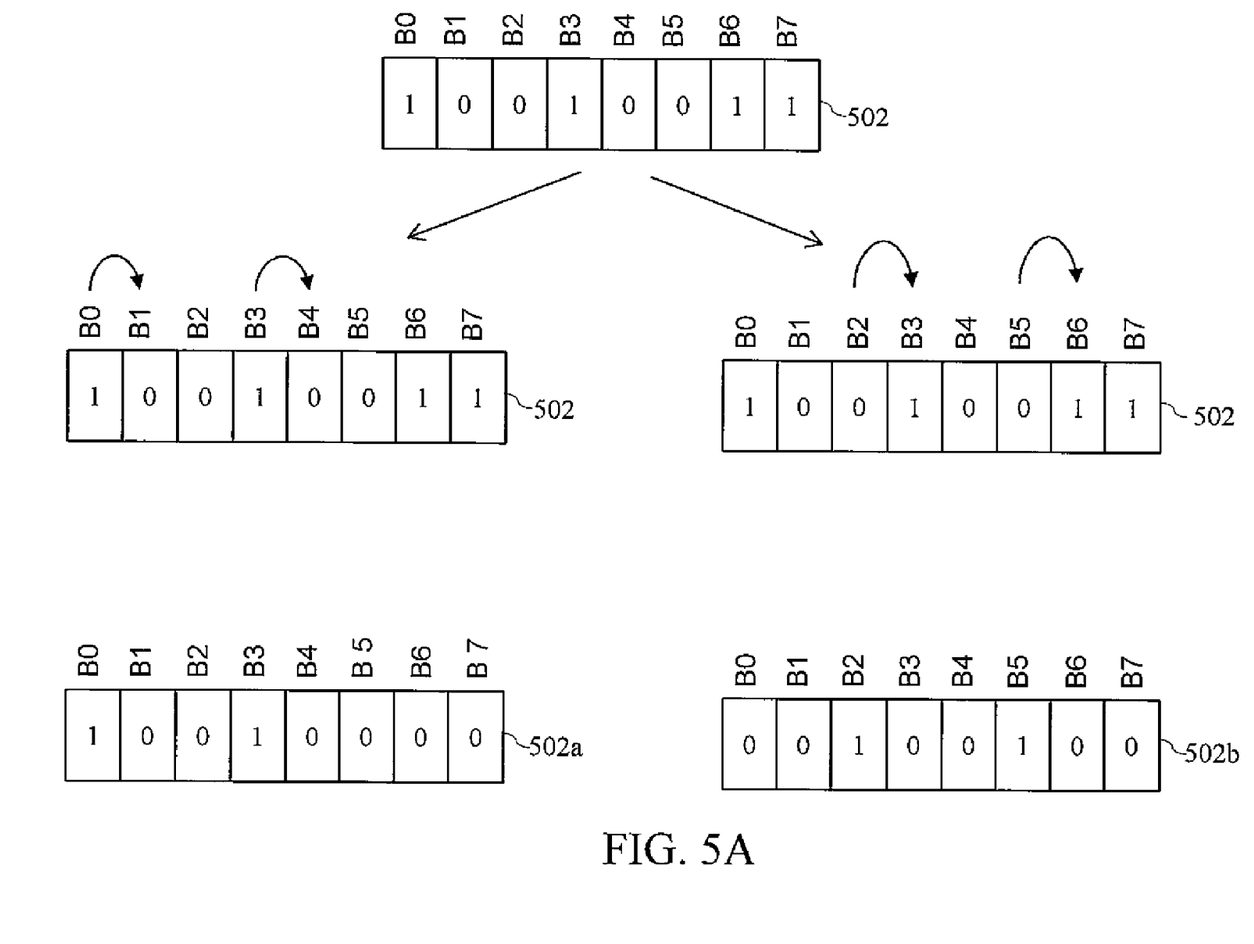
FIG. 5A is a schematic diagram illustrating beginning and ending bit positions of a zone of an input bit stream.

Referring now to FIG. 5A, a block diagram illustrating beginning and ending bit positions corresponding to a zone of an input bit stream in accordance with an embodiment of the present invention is shown. FIG. 5A includes an input bit stream 502, a beginning position vector 502a, and an ending position vector 502b. The input bit stream 502 illustrates bit transitions from binary one to binary zero and binary zero to binary one. In this example, the input bit stream is the transition vector 204d (shown in FIG. 2) and includes serially arranged bits in a bit stream {10010011}.

The beginning position vector 502a and the ending position vector 502b correspond to bit streams generated to register bit transitions corresponding to the one or more beginning bit positions and the ending bit positions respectively. One or more beginning bit positions for the input bit stream 502 are identified. As previously discussed, detection of a bit transition from a first binary value to a second binary value marks the beginning of a zone and a subsequent bit transition from the second binary value to the first binary value marks the end of the zone. Thus, the beginning positions are identified by detecting transition of a bit from a binary value one to binary zero, and the ending positions are identified by detecting transition of a bit from the binary zero to binary one. Further, the first binary value is one when the second binary value is zero, and when the first binary value is zero then the second binary value is one. For purposes of discussion, hereafter, the first binary value corresponds to binary one and the second binary value corresponds to zero.

As shown in FIG. 5A, bits at positions B0 and B3 transition from one to zero and therefore, correspond to the beginning bit positions. The bit positions corresponding to the beginning bit transitions are registered in the beginning position vector 502a. In an example, the beginning position vector 502a is generated with binary value one assigned to the beginning bit positions. Since, bit positions B0 and B3 correspond to a bit transition position, binary value one is assigned at B0 and B3 and the beginning position vector 502a is generated.

Additionally, one or more ending bit positions are identified based on transitions in the input bit stream 502 from zero to one. The bit positions corresponding to the ending bit transitions are registered in the ending position vector 502b. In an example, the ending position vector 502b is generated with binary one assigned to the ending bit positions. Since, bit positions B2 and B5 correspond to a bit transition position, binary value one is assigned at B2 and B5 and the ending position vector 502b is generated.

Figure 5B:
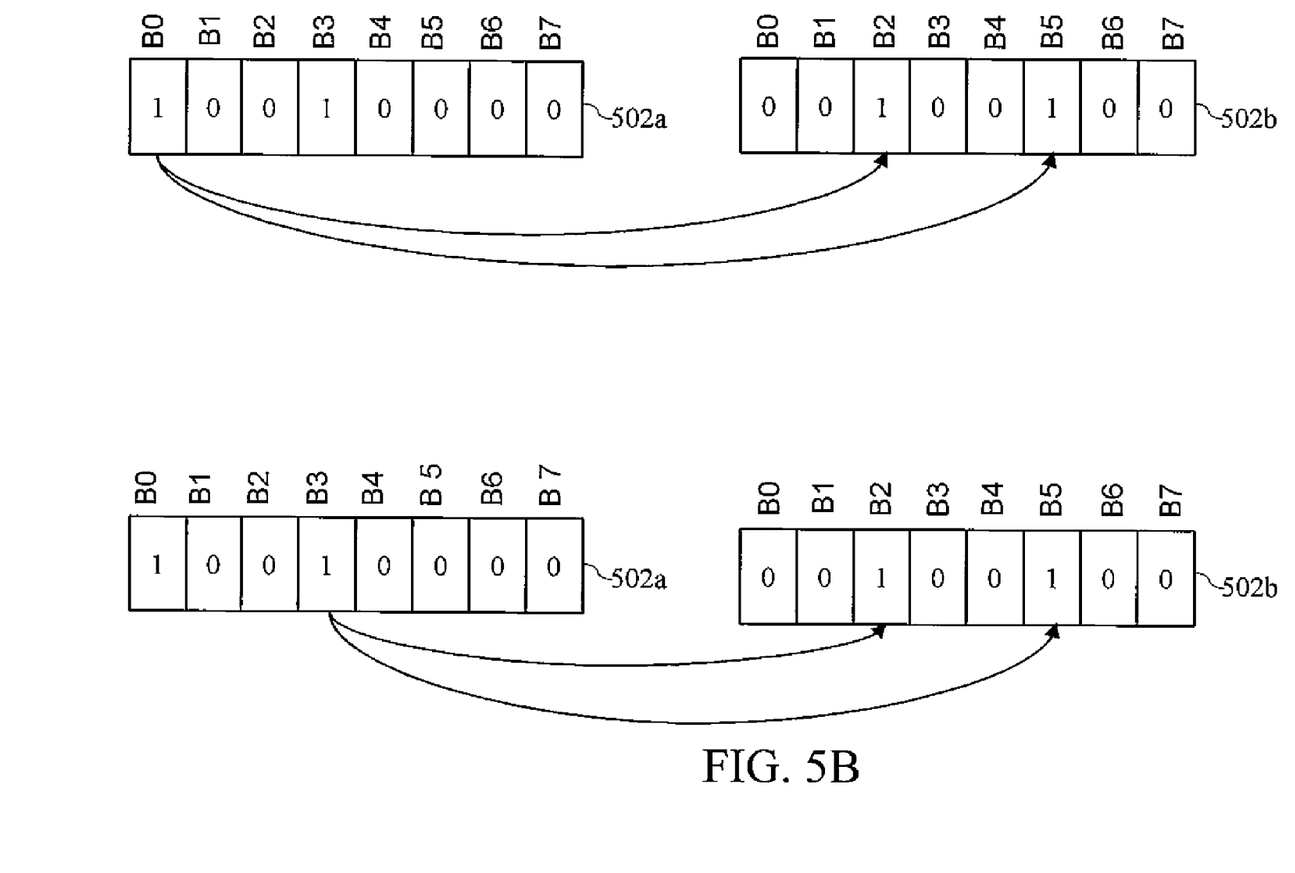
FIG. 5B is a schematic diagram illustrating various ending bit positions of a beginning bit position of a zone of an input bit stream.

Referring now to FIG. 5B, a block diagram illustrating association of a beginning bit position with various ending bit positions in accordance with an embodiment of the present invention is shown. FIG. 5B includes the beginning position vector 502a, and the ending position vector 502b.

Each beginning bit position is associated with the one or more identified ending bit positions. The beginning bit position B0 is associated with the identified ending bit positions B2 and B5 and the beginning bit position B3 is associated with the identified ending bit positions B2 and B5. Subsequently, two sets are generated for the beginning bit position B0, i.e., (B0, B2) and (B0, B5). Similarly, two sets are generated for the beginning bit position B3, i.e., (B3, B2) and (B3, B5).

In one example, the beginning position vector 502a and the ending position vector 502b are aligned together to associate each beginning bit position with the one or more ending bit positions.

Figure 5C:
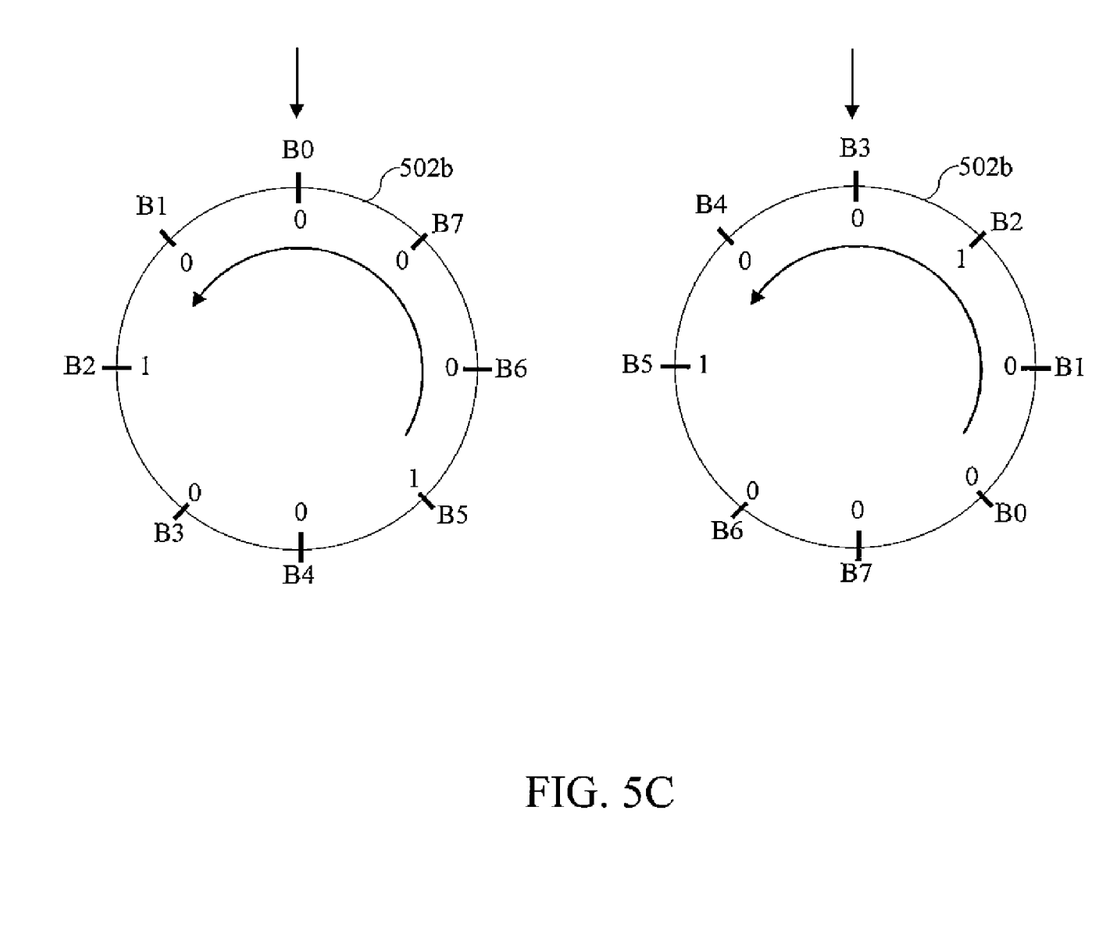
FIG. 5C is a schematic diagram illustrating an operation of a rotator at an ending position vector for associating a beginning bit position with an ending bit position in accordance with an embodiment of the present invention.

Referring now to FIG. 5C, a schematic diagram illustrating an operation of a rotator on the ending position vector 502b for associating each beginning bit position with at least one ending bit position, in accordance with an embodiment of the present invention, is shown. The rotator rotates the ending position vector 502b with respect to the beginning position vector 502a in a counter-clockwise direction to associate the beginning bit position with at least one ending bit position. In one example, the at least one ending bit position is the appropriate ending bit position corresponding to the beginning bit position for each identified zone. The ending position vector 502b is rotated until a binary value one corresponding to a first bit position, i.e, bit position B0 (as shown in figure) is detected. Subsequently, at least one ending bit position is associated with the beginning bit position. First, the ending position vector 502b is placed on the rotator in accordance with the beginning position vector 502a. Subsequently, an appropriate ending bit position is determined based on the proximity of the ending bit position corresponding to a beginning bit position from the one or more beginning bit positions. For the above example, the beginning bit position B3 is associated with the ending bit position B5. Similarly, the beginning bit position B0 is associated with B2. Thus, each identified beginning bit position in the beginning position vector 502a is associated with an ending bit position in the ending position vector 502b.

Figure 5D:
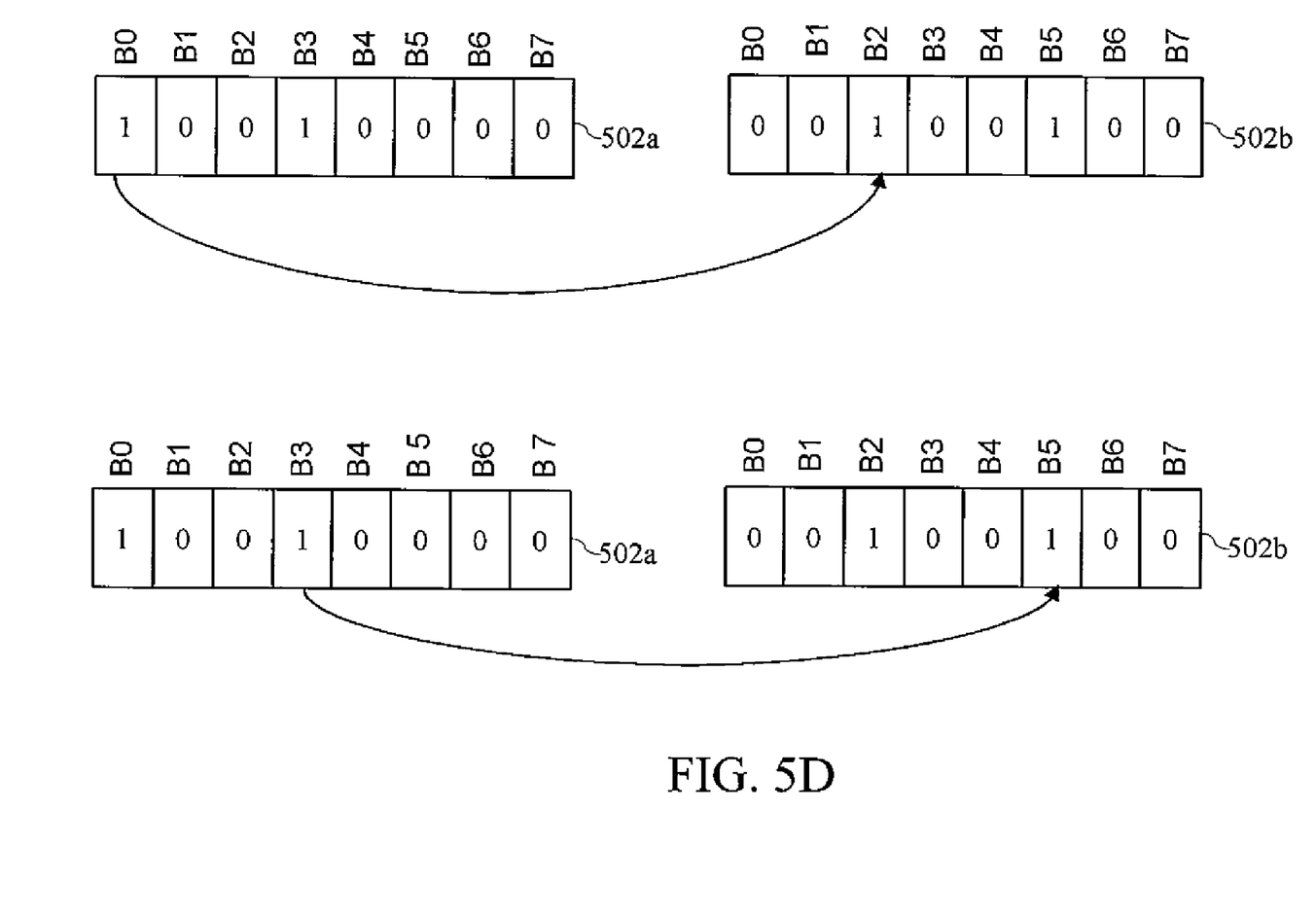
FIG. 5D is a schematic diagram illustrating an appropriate ending bit position corresponding to a beginning bit position of a zone of an input bit stream.

Referring now to FIG. 5D, a block diagram illustrating determination of an appropriate ending bit position corresponding to a beginning bit position from the one or more beginning bit positions, in accordance with an embodiment of the present invention is shown. FIG. 5D includes the beginning position vector 502a and the ending position vector 502b.

An appropriate ending bit position is a bit position from the one or more ending bit positions that is closest to the beginning bit position. One or more appropriate ending bit positions are determined in the bit stream such that at least one appropriate ending bit position is determined corresponding to each beginning bit position. In one embodiment of the invention, an appropriate ending bit position for a given beginning bit position is based on proximity, namely, the closest, next ending bit position. Thus, in this example, bit positions B2 and B5 are determined as the possible ending bit positions corresponding to the beginning bit positions B0 and B3 respectively. Subsequently, for each beginning bit position B0 and B3 an appropriate ending bit position is determined from the possible ending bit positions (B2 and B5) using the rotator (as explained in conjunction with FIG. 5C).

Each beginning bit position and a corresponding appropriate ending bit position corresponds to the beginning and ending of a zone of the input bit stream 502. For example, for the bit stream 502, as shown in FIG. 5D, two zones are identified, i.e., {1, 0, 1} corresponding to beginning bit position B0 and ending bit position B2 and {1, 0, 1} corresponding to beginning bit position B3 and ending bit position B5.

Zone statistics such as count of zones, lengths of zones, and center positions of zones, are calculated for each identified zone. For example, zone statistics for the first identified zone {1, 0, 1} are length=2 bits and center position=B1.

In accordance with an embodiment of the present invention, zone statistics for a zone {1, 0, 0, 1} corresponding to bits positioned at B0, B1, B2, & B3 will be length=3 bits and center position=B2. Further, each zone starts from a bit position immediately after the beginning bit position and ends at the appropriate ending bit position. In accordance with an embodiment of the present invention, in case two bit positions qualify for the center position of a zone then the bit position that is closer to the beginning of the zone boundary is selected as the center position of the zone. Alternatively, the bit position that is closer to the ending of the zone boundary may be selected as the center position of the zone.

Figure 6:
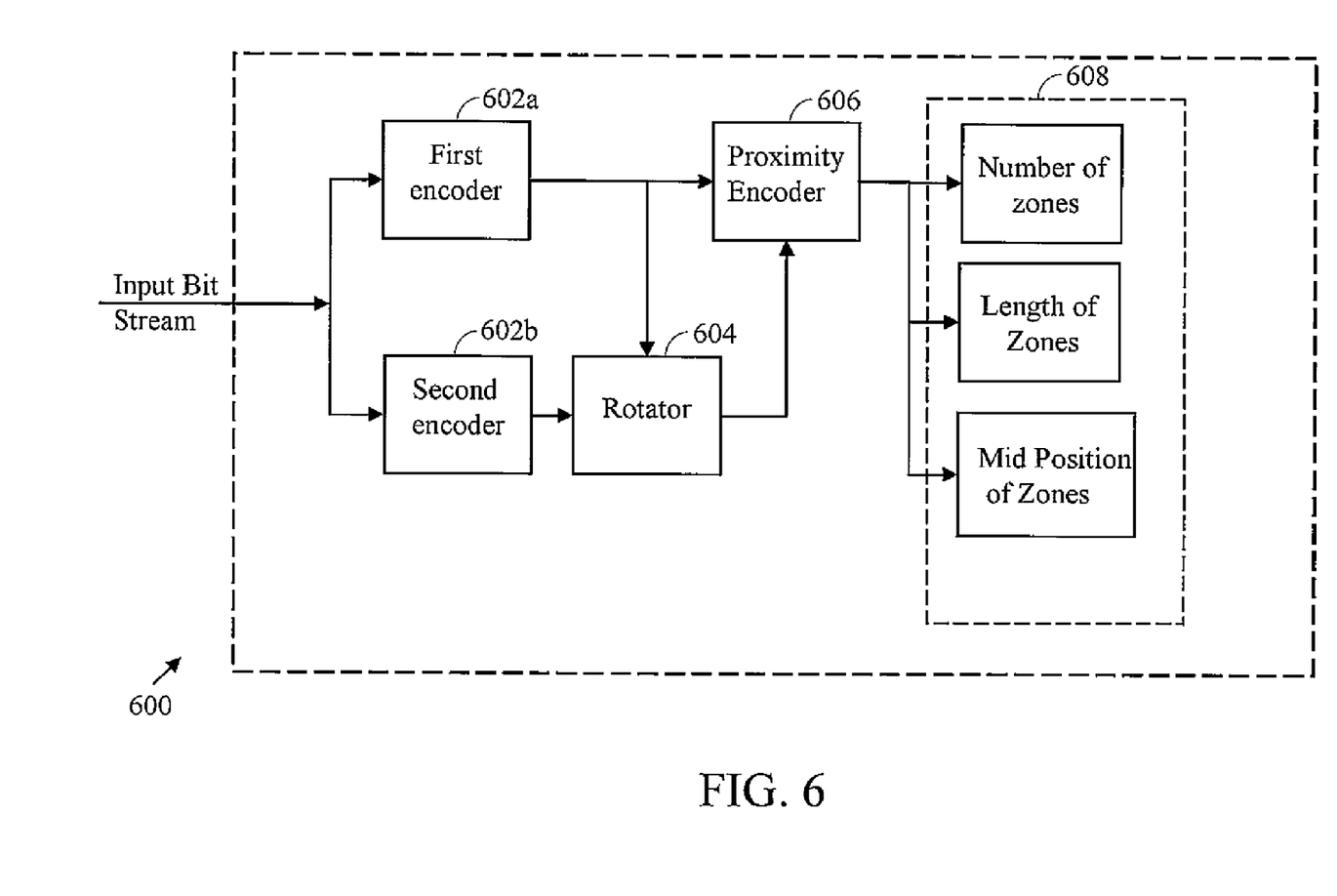
FIG. 6 is a schematic block diagram illustrating a zone identification and statistics calculation unit in accordance with an embodiment of the present invention.

Referring now to FIG. 6, a block diagram illustrating a zone identification and statistics calculation unit 600, in accordance with an embodiment of the present invention, is shown. The zone identification and statistics calculation unit 600 include encoders 602a and 602b, a rotator 604, a proximity encoder 606, and a statistics calculation unit 608.

An input bit stream is provided to the zone identification and statistics calculation unit 600 from a receiver (not shown). As previously discussed, the input bit stream is a serial bit stream. One or more zone statistics a count of one or more zones belonging to an input bit stream, a center bit position of each one or more zones, and a length of each one or more zones are determined. A zone is a set of non-transitioning bits in the input bit stream. The input bit stream includes serially arranged bits. The input bit stream is provided to the first and second encoders 602a and 602b. The encoders 602a and 602b identify one or more beginning bit positions and ending bit positions corresponding to one or more zones of the input bit stream. Also as previously discussed, a beginning bit position and an ending bit position correspond to positions where a bit of the input bit stream transitions from one binary value to another. The encoders 602a and 602b assign a binary value one corresponding to the one or more identified beginning bit positions and ending bit positions respectively to generate a beginning position vector and an ending position vector respectively. Since, the encoders 602a and 602b are connected in parallel, and thus each encoder receives the input bit at substantially the same time. The encoders 602a and 602b process the input bit stream in parallel and provide their outputs substantially simultaneously. Note, as will be understood by those of skill in the art, simultaneously means at the same time and substantially simultaneously means the same time give or take a few nanoseconds to account for any difference in wire delays (wire length differences to/from the encoders) and minor differences in gate delays due that may be caused by signal loading, etc.

The encoders 602a and 602b are connected to the rotator 604 that associates each beginning bit position with at least one ending bit position for each zone in the input bit stream. The rotator 604 aligns each beginning bit position with one or more ending bit positions to associate each beginning bit position with at least one ending bit position for each identified zone. In accordance with an embodiment of the present invention, the rotator 604 rotates the ending position vector with respect to the beginning position vector counter-clockwise in order to align each beginning bit position with one or more ending bit positions (as explained above in conjunction with FIG. 5C). The encoder 602a and the rotator 604 are connected to the proximity encoder 606.

The proximity encoder 606 determines an appropriate ending bit position from the one or more ending bit positions corresponding to each of the beginning bit positions. The appropriate ending bit position is determined based on predefined criteria that include proximity of the one or more ending bit positions with the corresponding beginning bit position. Thus, the ending bit position that is closest to the beginning bit position is determined as the appropriate ending bit position.

The proximity encoder 606 is connected to the statistics calculation unit 608, which calculates the one or more zone statistics using the one or more beginning bit positions and the one or more appropriate ending bit positions. The one or more zone statistics are calculated substantially simultaneously. In one embodiment of the invention, the statistics calculation unit 608 includes separate circuits for calculating the number of zones, the lengths of the zones, and the mid-positions of the zones, and thus, the zone statistics are calculated in parallel.

Figure 7:
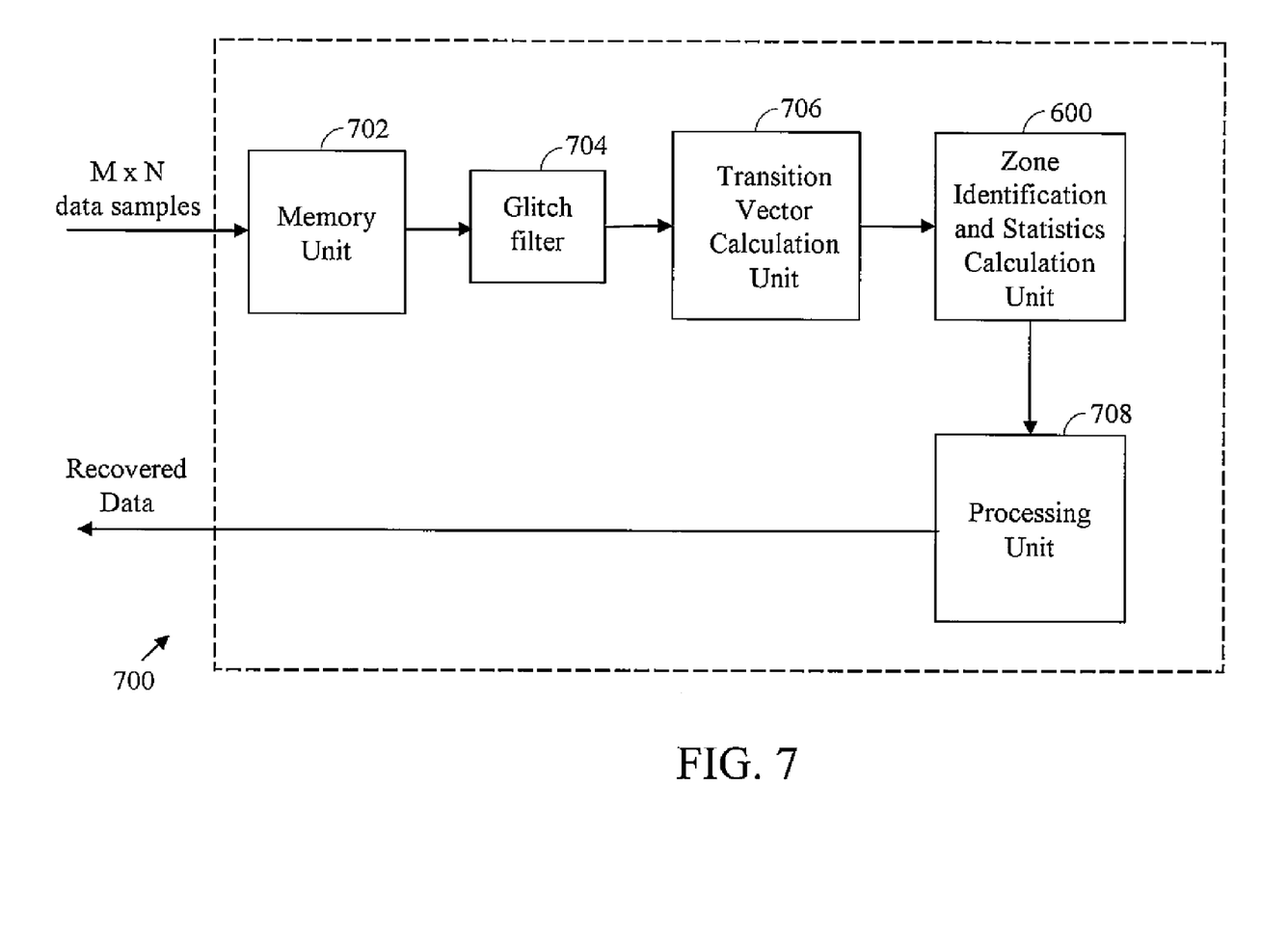
FIG. 7 is a schematic block diagram illustrating a clock and data recovery unit in accordance with an embodiment of the present invention.

Referring now to FIG. 7, a block diagram illustrating a clock and data recovery unit 700, in accordance with an embodiment of the present invention, is shown. The clock and data recovery unit 700 includes a memory unit 702, a glitch filter 704, a transition vector calculation unit 706, zone identification and statistics calculation unit 600, and a processing unit 708.

The clock and data recovery unit 700 is connected to an oversampling unit and a serial-to-parallel data converter (not shown). The oversampling unit receives an input bit stream and oversamples the received input bit stream to generate one or more sets of data samples arranged in a matrix as shown in FIG. 2. The oversampling is performed using a plurality of phases of a reference clock signal such that each set of data samples corresponds to one bit width of a received data of the received input bit stream. Each set of data samples comprises a received data bit or contiguous portions of more than one received data bits corresponding to one bit duration. The serial-to-parallel data converter converts a serial stream of oversampled bits into parallel streams of sets of data samples.

The memory unit 702 receives and stores the parallel streams of sets of data samples. In accordance with an embodiment of the present invention, a parallel stream of M sets of data samples is provided to the memory unit 702. Each set of data samples includes N data samples. Therefore, the parallelized sets of data samples include M×N data samples. The memory unit 702 stores the data samples in a matrix format of M×N order. In accordance with an embodiment of the present invention, the memory unit 702 may be a Random Access Memory (RAM), a register set, a flip-flop based memory or the like.

As is known by those of skill in the art, glitches may be present in the received sets of data samples. For example, reflection due to impedance mismatch between a source and load circuit, inductive and capacitive coupling in the circuit due to the current flowing in a neighboring circuit, cross-talk between signal lines, ringing, and other signal integrity issues can cause glitches. These glitches are removed by the glitch filter 704 that is connected to the memory unit 702. The output of the glitch filter 704 is a glitch free parallel stream of data samples. As basic glitch filters are known in the art, a detailed explanation is not required for a complete understanding of the present invention.

The glitch filter 704 is connected to a transition vector calculation unit 706 that calculates a transition vector corresponding to the oversampled input bit stream (includes parallel stream of sets data samples). The transition vector is calculated corresponding to one or more sets of non-transitioning phases corresponding to the data samples. Further, the transition vector is calculated based on a predefined method, which was discussed above.

Bits in the transition vector that correspond to the non-transitioning phases are assigned a fixed binary value. In accordance with an embodiment of the present invention, a binary value 0 is assigned to the bit positions that correspond to the non-transitioning phases. Thus, the transition vector includes sets of continuous length of zeroes and each continuous length of zeroes corresponds to a zone. For clock and data recovery the zones are identified and their statistics are calculated through the zone statistics identification and calculation unit 600. The working of the zone statistics identification and calculation unit 600 was explained above in conjunction with FIG. 6.

The processing unit 708 receives the zone statistics from the zone identification and statistics calculation unit 600 and selects a center phase that accurately represents the bits of the input bit stream. The selected center phase corresponds to a non-transitioning phase that is selected using the one or more identified zones in the transition vector. The data samples corresponding to the center phase are extracted and then clock signal and data bits are recovered.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A method for determining one or more zone statistics of an input bit stream, wherein a zone is a set of non-transitioning bits in the input bit stream, and wherein the zone statistics comprise at least one of a count of one or more zones of the input bit stream, a length of each one or more zones, the method comprising:

identifying one or more beginning bit positions and one or more ending bit positions of the one or more zones, wherein the beginning bit position corresponds to a position where a transition occurs from a first binary value to a second binary value in the input bit stream and the ending bit position corresponds to a position where transition occurs from the second binary value to the first binary value in the input bit stream, and wherein the one or more beginning and ending bit positions are identified substantially simultaneously by processing the bits of the input bit stream in parallel;

associating each beginning bit position with at least one ending bit position of the one or more ending bit positions;

determining one or more appropriate ending bit positions from the one or more ending bit positions corresponding to the one or more beginning bit positions, wherein each or the one or more appropriate ending bit positions corresponds to one beginning bit position, and wherein the one or more appropriate ending bit positions are determined based on a predefined criteria; and calculating the one or more zone statistics using the one or more beginning bit positions and the one or more appropriate ending bit position, wherein the one or more zone statistics are calculated substantially simultaneously.

2. The method of claim 1, further comprising aligning each beginning bit position with one or more ending bit positions to associate each beginning bit position with at least one ending bit position of the one or more ending bit positions.

3. The method of claim 1, wherein the appropriate ending bit position is the closest ending bit position from the corresponding beginning bit position.

4. A system for determining one or more zone statistics of an input bit stream, wherein a zone is a set of non-transitioning bits in the input bit stream, and wherein the zone statistics comprise at least one of a count of the one or more zones of the input bit stream, a length of each of the one or more zones, and a center bit position of each of the one or more zones, the system comprising:

first and second encoders that receive the input bit stream, wherein the first and second encoders identify one or more beginning bit positions and one or more ending bit positions of the one or more zones, wherein the beginning bit positions correspond to positions where bits of the input bit stream transition from a first binary value to a second binary value, and the ending bit positions correspond to positions where bits of the input bit stream transition from the second binary value to the first binary value, and wherein the one or more beginning bit positions and the one or more ending bit positions are identified substantially simultaneously via parallel processing;

a rotator, connected to the first and the second encoders, for associating each of the one or more beginning bit positions with at least one of the one or more ending bit positions;

a proximity encoder, connected to the first encoder and the rotator, for determining one or more appropriate ending bit positions from the one or more ending bit positions corresponding to the one or more beginning bit positions, wherein each appropriate ending bit position corresponds to one beginning bit position, and wherein the appropriate ending bit position is determined based on a predefined criteria; and a statistics calculation unit, connected to the proximity encoder, for calculating the one or more zone statistics using the one or more beginning bit positions and the one or more appropriate ending bit positions, wherein the one or more zone statistics are calculated substantially simultaneously.

5. The system of claim 4, wherein the one or more zone statistics are determined for performing run length encoding.

6. The system of claim 4, wherein each of the first encoder and the second encoder generates a beginning position vector and an ending position vector.

7. The system of claim 4, wherein the rotator aligns each beginning bit position with one or more ending bit positions to associate each beginning bit position with at least one ending bit position of the one or more ending bit positions.

8. The system of claim 4, wherein the appropriate ending bit position is the closest ending bit position from the corresponding beginning bit position.

9. A receiver for recovering clock and data from an input bit stream, wherein the input bit stream is over sampled using a plurality of phases of a reference clock signal to generate a set of data samples, the receiver comprising:

a memory for receiving and storing the set of data samples of the bit stream;

a transition vector calculation unit, connected to the memory, for calculating a transition vector corresponding to the set of data samples, wherein the transition vector is calculated based on one or more sets of non-transitioning phases in the set of data samples;

a zone identification and statistics calculation unit, connected to the transition vector calculation unit, for determining one or more zone statistics of the transition vector, wherein a zone is a set of non-transitioning bits in the transition vector, and wherein the zone statistics comprise at least one of a count of the one or more zones of the transition vector, a length of each of the one or more zones, and a center bit position of each of the one or more zones, wherein the zone identification and statistics calculation unit comprises:

first and second encoders for identifying one or more beginning bit positions and one or more ending bit positions corresponding to the one or more zones of the transition vector, wherein the one or more beginning bit positions correspond to positions where a bit of the transition vector transitions from a first binary value to a second binary value, and the one or more ending bit positions correspond to positions where a bit of the transition vector transitions from the second binary value to the first binary value, and wherein the one or more beginning and ending bit positions are identified substantially simultaneously;

a rotator, connected to the first and the second encoders, for associating each beginning bit position of the one or more beginning bit positions with at least one ending bit position of the one or more ending bit positions;

a proximity encoder, connected to the first encoder and the rotator, for determining one or more appropriate ending bit positions from the one or more ending bit positions corresponding to the one or more beginning bit positions, wherein each appropriate ending bit position corresponds to one beginning bit position, and wherein the appropriate ending bit position is determined based on a predefined criteria; and a statistics calculation unit, connected to the proximity encoder, for calculating the one or more zone statistics using the one or more beginning bit positions and the one or more appropriate ending bit positions, wherein the one or more zone statistics are calculated substantially simultaneously; and a processing unit connected to the zone identification and statistics calculation unit for recovering clock and data from the transition vector using at least one of the zone statistics.

10. The receiver of claim 9, wherein each of the first encoder and the second encoder generates a beginning position vector and an ending position vector.

11. The receiver of claim 9, wherein the rotator aligns each beginning bit position with one or more ending bit positions to associate each beginning bit position with at least one ending bit position of the one or more ending bit positions.

12. The receiver of claim 9, wherein the appropriate ending bit position is the closest ending bit position from the corresponding beginning bit positions.

* * * * *